United States Patent
Schwalke et al.

(10) Patent No.: US 6,913,983 B1
(45) Date of Patent: Jul. 5, 2005

(54) INTEGRATED CIRCUIT ARRANGEMENT AND METHOD FOR THE MANUFACTURE THEREOF

(75) Inventors: Udo Schwalke, Heldenstein (DE); Burkhard Ludwig, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/462,994
(22) PCT Filed: May 11, 1998
(86) PCT No.: PCT/DE98/01312
§ 371 (c)(1), (2), (4) Date: Jan. 14, 2000
(87) PCT Pub. No.: WO99/04431
PCT Pub. Date: Jan. 28, 1999

(30) Foreign Application Priority Data

Jul. 18, 1997 (DE) .............................. 197 30 974

(51) Int. Cl.⁷ .......................... H01L 21/20; H01L 29/80
(52) U.S. Cl. ..................................... 438/382; 257/358
(58) Field of Search ................. 438/171, 190, 438/197, 210, 238, 329, 381–384, 618, 699, 233, 622, 626, 652, 185, 183, 563, 567, 199; 257/350, 356, 357–363, 380–382, 508, 516, 630, E27.001, E27.009, E27.01, E27.101, E29.326, E21.363, 774, 379

(56) References Cited

U.S. PATENT DOCUMENTS

| | | | | |
|---|---|---|---|---|
| 4,590,508 A | * | 5/1986 | Hirakawa et al. | ........... 257/379 |
| 4,832,789 A | | 5/1989 | Cochran et al. | |
| 4,945,067 A | | 7/1990 | Huang | |
| 5,416,343 A | | 5/1995 | Slotboom et al. | |
| 5,441,915 A | | 8/1995 | Lee | |
| 5,521,113 A | * | 5/1996 | Hsue et al. | ............... 438/238 |
| 5,698,902 A | * | 12/1997 | Uehara et al. | .............. 257/773 |
| 5,714,410 A | * | 2/1998 | Kim | ............................ 438/199 |
| 5,731,234 A | * | 3/1998 | Chen | .......................... 438/238 |
| 5,736,421 A | * | 4/1998 | Shimomura et al. | ........ 438/253 |
| 5,866,449 A | * | 2/1999 | Liaw et al. | .................. 438/238 |
| 5,869,396 A | * | 2/1999 | Pan et al. | .................... 438/647 |
| 5,960,270 A | * | 9/1999 | Misra et al. | ................. 438/197 |
| 5,994,179 A | * | 11/1999 | Masuoka | ..................... 438/227 |
| 6,069,036 A | * | 5/2000 | Kim | ............................ 438/238 |
| 6,074,938 A | * | 6/2000 | Asamura | ..................... 438/533 |
| 6,204,137 B1 | * | 3/2001 | Teo et al. | .................... 438/305 |
| 6,207,543 B1 | * | 3/2001 | Harvey et al. | .............. 438/586 |
| 6,236,101 B1 | * | 5/2001 | Erdeljac et al. | ............. 257/531 |
| 6,300,653 B1 | * | 10/2001 | Pan | ............................. 257/296 |

FOREIGN PATENT DOCUMENTS

| | | |
|---|---|---|
| EP | 0 661 744 A1 | 7/1995 |
| JP | 08-236767 | 9/1996 |

OTHER PUBLICATIONS

D. Widmann, et al., "Technologie hochintegrierter Schaltungen", 2d. Edition, Springer Verlag, pp. 346–347, 1007.

* cited by examiner

Primary Examiner—George Fourson
Assistant Examiner—Brook Kebede
(74) Attorney, Agent, or Firm—Schiff Hardin LLP

(57) ABSTRACT

A doped region is provided on a substrate. A plane with conductive useful structures and a conductive filler structure is arranged at the surface of the substrate. The conductive filler structure is conductively connected to the doped region. In this way, charging of the conductive filler structure, which is provided for improving the planarity of the circuit arrangement and has no circuit-oriented function, is avoided.

11 Claims, 4 Drawing Sheets

INTEGRATED CIRCUIT ARRANGEMENT AND METHOD FOR THE MANUFACTURE THEREOF

BACKGROUND OF THE INVENTION

The present invention relates to an integrated circuit arrangement and method for the manufacture thereof.

The question of planarity is increasingly gaining in significance in the realization of integrated circuit arrangements having high packing density and, in particular, having structural sizes below 0.25 µm. In the manufacture of the integrated circuit arrangements, useful structures that have a circuit-oriented function in the circuit arrangement are generated on a semiconductor substrate. Such useful structures are, for example, terminal electrodes, gate electrodes or interconnects. These useful structures are respectively manufactured in planes by structuring a previously produced layer. Insulation layers are provided between successive planes. These insulation layers are planarized by polishing and/or etching.

The planarity that can be achieved when planarizing layers is thereby dependent on the geometrical density of the useful structures in the respective plane. Given an extremely non-uniform occupation with useful structures, large spaces locally derive wherein irregularities occur in the planarization process. It has therefore been proposed (see, for example, D. Widmann, H. Mader, H. Friedrich Technologie Hochintegrierter Schaltungen, 2nd Edition, Springer-Verlag, 1996, pages 346 through 347) to insert filling structures between the useful structures that have no circuit-oriented function but that nonetheless increase the local geometrical density. As a result thereof, a uniform occupation in the respective plane is assured, this enabling a higher planarity following planarization steps.

When the useful structures and the filler structures are composed of conductive material, then a charging of the filler structures can occur during operation. In order to avoid this, the filler structures are applied to a fixed potential, as disclosed in Widmann, et al. This contacting to a fixed potential ensues via specific wiring arranged in a metallization plane above the useful and filler structures. This additional wiring and the contacts between the additional wiring and the filler structures make production of the layout more difficult.

SUMMARY OF THE INVENTION

It is an object of the present invention to provide an integrated circuit arrangement that can be manufactured with high planarity, whereby a charging of electrically conductive filler structures is avoided and for which the layout can be produced with reduced outlay. Further it is an object of the present invention to provide a method for manufacturing such a circuit arrangement.

This object is inventively achieved in accordance with the present invention in an integrated circuit arrangement comprising a semiconductor substrate having at least one doped region, and a plane arranged on a surface of the substrate and having a number of conductive useful structures and at least one conductive filler structure, the conductive filler structure being conductively connected to the doped region.

This object is also inventively achieved in accordance with the present invention in a method for manufacturing an integrated circuit arrangement, the method comprising the steps of: forming a doped region in a semiconductor substrate; forming a plane on a surface of said semiconductor substrate by applying and structuring a conductive layer, said plane having a number of conductive useful structures and at least one conductive filler structure; producing an insulation layer surrounding and covering said conductive useful structures and said conductive filler structure; and producing a conductive connection between said conductive filler structure and said doped region.

A doped region is provided in a semiconductor substrate in the integrated circuit arrangement. A plane with conductive useful structures and at least one conductive filler structure is arranged at the surface of the semiconductor substrate. The conductive useful structures are, for example, terminal electrodes, gate electrodes, interconnect sections, wirings or the like. The conductive filler structure is conductively connected to the doped region. For example, the substrate body itself or a doped well in which active components are arranged is suitable as a doped region. The substrate body and/or the doped well in which components are arranged are therefor charged with a fixed supply voltage in integrated circuit arrangements during operation. The connection of the doped region to the conductive filler structure assures that the conductive filler structure also lies at this potential. Since the doped well or the substrate body are already connected to fixed potential, additional wiring that is only provided for the purpose of connecting the filler structures can be omitted in the present inventive integrated circuit arrangement. The layout is thus simplified. In particular, it can be produced by automatic layout generation. The position of the filler structure can be determined by a program-controlled determination.

The electrical connection of the conductive filler structure to the doped region preferably ensues via a through hole and a contact. The through hole overlaps the conductive filler structure and the doped region, so that the surface of the conductive filler structure and of the doped region are in communication with the contact. The through hole and the contact are preferably produced simultaneously with through holes and contacts to conductive useful structures. No additional process steps are therefore required for this purpose.

Since only extremely slight currents (chargings, capacitative shift currents, etc.) need be eliminated, an overlapping contact is not compulsory. On principle, a side wall contact surface already suffices. Current elimination via other high-impedance components is suitable for this purpose.

For example, a MOS (completely or partially activated), two anti-polar connected diodes or the like are suitable as components for connection between the conductive filler structure and the doped region. They are realized, for example, in that the filler structure is conducted beyond the insulation zone and is connected to the useful structure with a contact, for example a junction.

It lies within the scope of the present invention to arrange a metallization layer above the plane wherein the conductive filler structure is arranged and to connect the filler structure to the metallization layer via a further contact, through which the metallization layer thus lies at the same potential as the doped region during operation. The contact and the further contact then form an additional integrated contact for the doped region.

The plane in which the conductive filler structure is arranged can be either a gate plane that is arranged in the proximity of the surface of the semiconductor substrate or a metallization plane that is arranged above the gate plane and/or further metalization planes.

For manufacturing the integrated circuit arrangement, a doped region is formed in the semiconductor substrate. The plane with conductive useful structures and at least one conductive filler structure is formed on the semiconductor substrate by application and structuring of a conductive layer. An insulation structure is generated that surrounds the conductive useful structures and the conductive filler structure and covers them. Since the conductive useful structures and the conductive filler structure are formed of the conductive layer, they exhibit essentially the same height. The connection between the doped region and the conductive filler structure is preferably produced by opening a through hole, which overlaps the conductive filler structure and the doped region, and by formation of a contact.

It lies within the scope of the present invention to employ a monocrystalline silicon wafer, the monocrystalline silicon layer of a SOI substrate with a carrier wafer, an insulating layer and a monocrystalline silicon layer or a substrate that contains SiC as the semiconductor substrate.

The connection of the conductive filler structure to the doped region can be alternatively undertaken via a local wiring level. What is referred to as local wiring level is an electrically conductive connection that is effective in the lateral environment. Local wiring levels are formed, for example, of $TiSi_2$ in the form of strip-shaped conductors, what is referred to as a $TiSi_2$ strap.

When the plane in which the conductive filler structure is arranged is the gate plane, the conductive useful structures contain gate electrodes. The gate electrodes can be formed either by structuring a conductive layer, from which the conductive filler structure is then formed, or by structuring a number of sub-layers.

It lies within the scope of the present invention that the part of the doped region that is overlapped by the through hole for connection to the conductive filler structure is separated from parts of the doped region wherein active elements of the circuit arrangement are arranged, being separated therefrom by an insulation structure, for example a trench filled with insulating material. In this case, the doped region extends more deeply into the substrate than the insulation structure. As a result thereof, short-circuits between active elements and the contact are avoided.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 1:
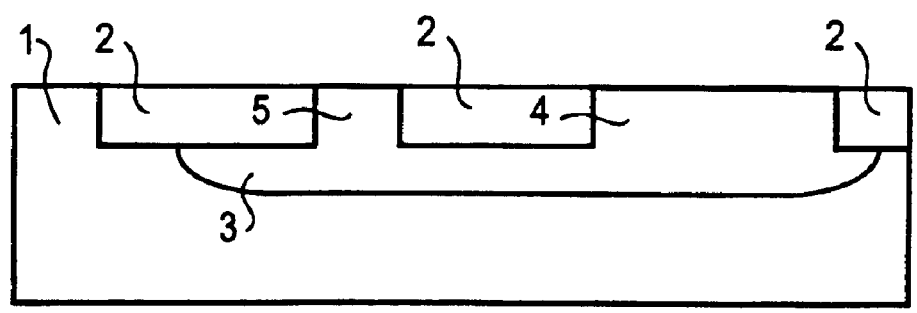
FIG. 1 shows is a cross-section through a semiconductor substrate with insulation regions and a doped well.

Referring to FIG. 1, insulation trenches 2 are formed in the surface of a substrate 1 of silicon by etching trenches and filling the trenches with insulating material. The filling of the insulation trenches 2 ensues by planarizing steps, for example by chemical-mechanical polishing. Subsequently, a masked ion implantation for formation of a p-doped well 3 is implemented upon employment of photolithographic process steps. The doped well 3 is doped, for example, with boron and a dopant concentration of $5 \times 10^{17}$ at/cm$^3$.

The doped well 3 comprises a greater depth than the insulation trenches 2. The doped well 3 is laterally surrounded by one of the insulation trenches 2. A further insulation trench 2 is arranged such within the doped well 3 that the doped well 3 adjoins the surface of the substrate 1 in an active region 4 and in a terminal region 5. The active region 4 is provided for the acceptance of active elements.

The depth of the doped well 3 amounts, for example, to 1 $\mu$m. The depth of the insulation trenches 2 amounts, for example to 400 nm.

Figure 2:
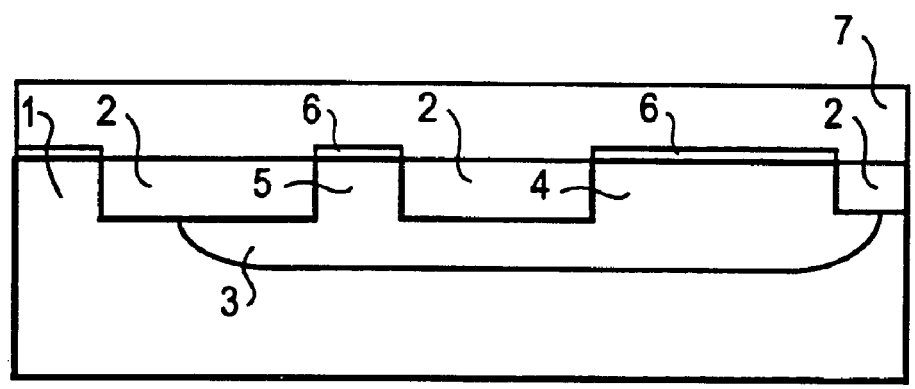
FIG. 2 shows the cross-section through the semiconductor substrate as shown in FIG. 1 after formation of a gate oxide and deposition of a conductive layer.

Referring to FIG. 2, subsequently, a gate oxide 6 is formed, for example by thermal oxidation. The gate oxide 6, for example, is formed in a layer thickness of 6 mm. Subsequently, a conductive layer 7 is deposited. Any material that is suitable for formation of gate electrodes is suitable for the conductive layer 7, particularly doped polysilicon, metal silicide, TiN. The conductive layer 7 is formed in a layer thickness of, for example, 200 nm.

Figure 3:
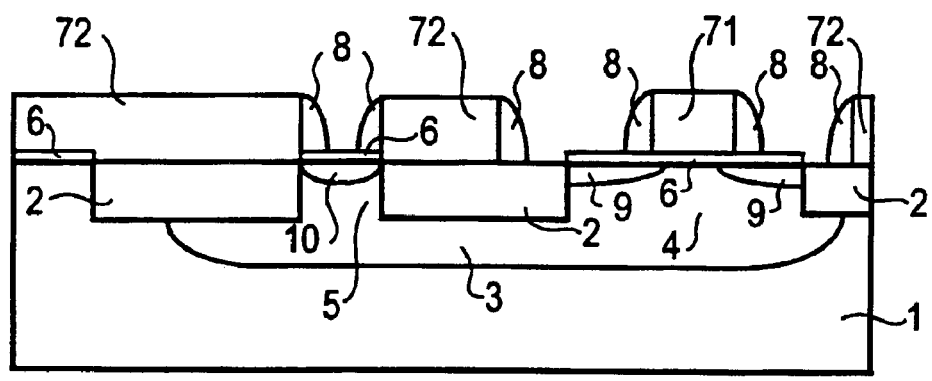
FIG. 3 shows the cross-section through the semiconductor substrate as shown in FIG. 1 after structuring the conductive layer for forming conductive useful structures and conductive filler structures and after formation of source/drain regions and a well contact.

Referring to FIG. 3, upon employment of photolithographic process steps, the conductive layer 7 is structured such that conductive useful structures 71 and conductive filler structures 72 are formed therefrom. The conductive useful structures 71 are, for example, gate electrodes. The conductive filler structures 72 have no circuit-oriented function. They are arranged such that a uniform geometrical occupation by the conductive useful structures 71 and the conductive filler structures 72 is established.

$SiO_2$ spacers 8 are formed at the side walls of the conductive useful structures 71 and of the conductive filler structure 72 by conformal deposition and anisotropic re-etching of a $SiO_2$ layer.

Source/drain regions 9 are formed self-aligned relative to the conductive useful structure 71 by masked ion implantation wherein the surface of the active region 4 is uncovered but the surface of the terminal region 5 is covered. The source/drain regions 9 are, for example, doped with arsenic or phosphorous and comprise a dopant concentration of $8 \times 10^{19}$ at/cm$^3$.

Upon employment of a further mask, which covers the active region 4 but leaves the terminal region 5 uncovered, a well contact 10 is subsequently formed. The well contact 10 is doped, for example, with boron and comprises a dopant concentration of $6 \times 10^{19}$ at/cm$^3$.

Figure 4:
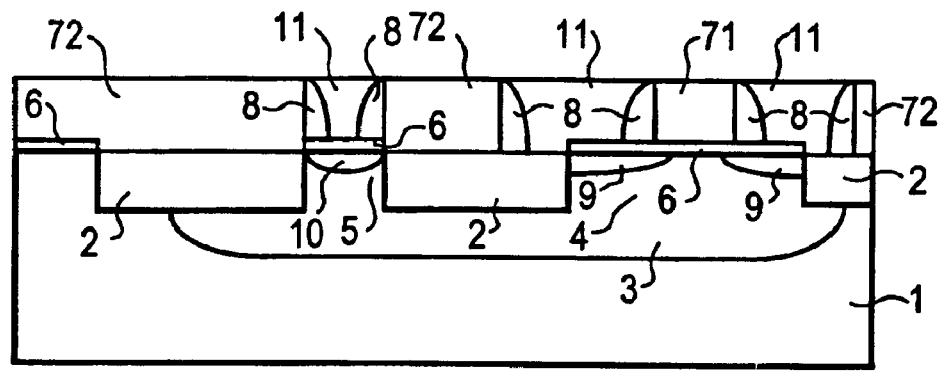
FIG. 4 shows the cross-section through the semiconductor substrate as shown in FIG. 1 after formation of a planarizing insulation layer.

Referring to FIG. 4, subsequently a planarizing insulation layer 11 is formed, this being ground back to such an extent by chemical-mechanical polishing that it terminates in height with the conductive useful structure 71 and the conductive filler structures 72. When planarizing the planarizing insulation layer 11, the conductive useful structure 71 and the conductive filler structures 72 act as planarization supporting points.

Figure 5:
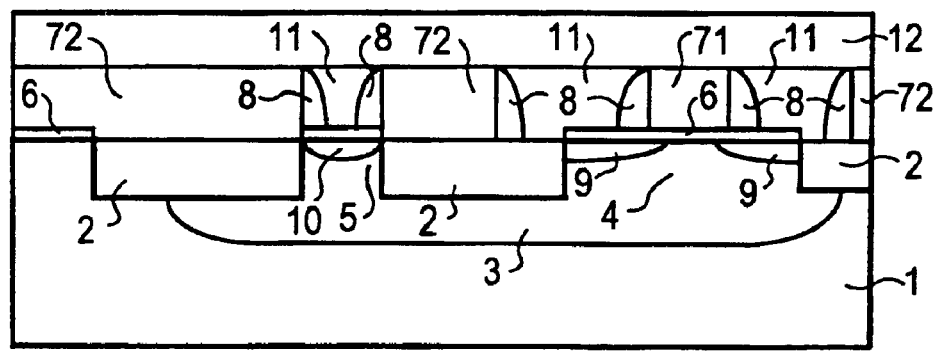
FIG. 5 shows the cross-section through the semiconductor substrate as shown in FIG. 1 after formation of an intermediate oxide layer.
Figure 6:
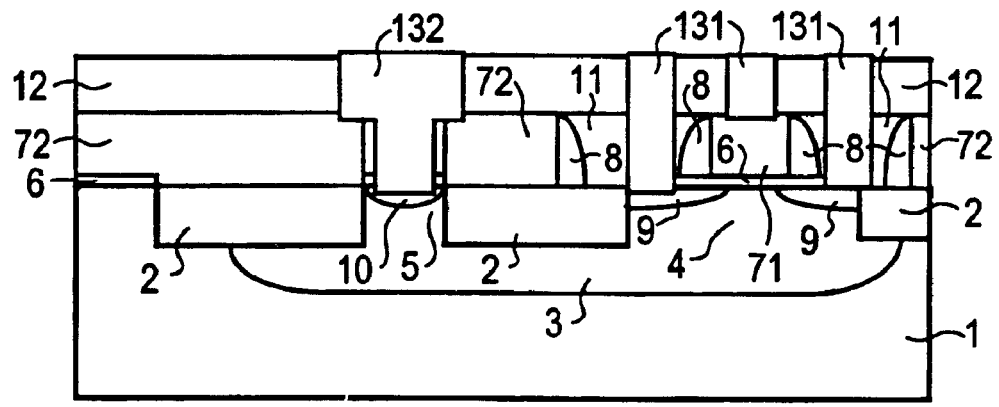
FIG. 6 shows the cross-section through the semiconductor substrate as shown in FIG. 1 after formation of through holes and contacts.

Referring to FIG. 5, subsequently a first intermediate oxide layer 12 is deposited. Referring to FIG. 6, through holes to the source/drain regions 9, to the conductive useful structure 71 and to the well contact 10 and the neighboring, conductive filler structures 72 are subsequently etched with the assistance of photolithographic process steps and anisotropic dry etching. By filling the through holes with metal, for example tungsten, contacts 131 to the source/drain regions 9 and the conductive useful structure 71 and an overlapping contact 132 to the well contact 10 and the neighboring, conductive filler structures 72 are formed. The overlapping contact 132 is in communication both with the surface of the neighboring, conductive filler structures 72 as well as with the surface of the well contact. As a result thereof, the filler structures 72 are connected to the doped well 3 via the well contact 10.

Alternatively, the overlapping contact 132 is arranged such that it meets the surface of the substrate 1. In this case, a substrate contact is formed at the surface of the substrate 1 by implantation with dopant, which effects the same conductivity type that the substrate comprises.

Figure 7:
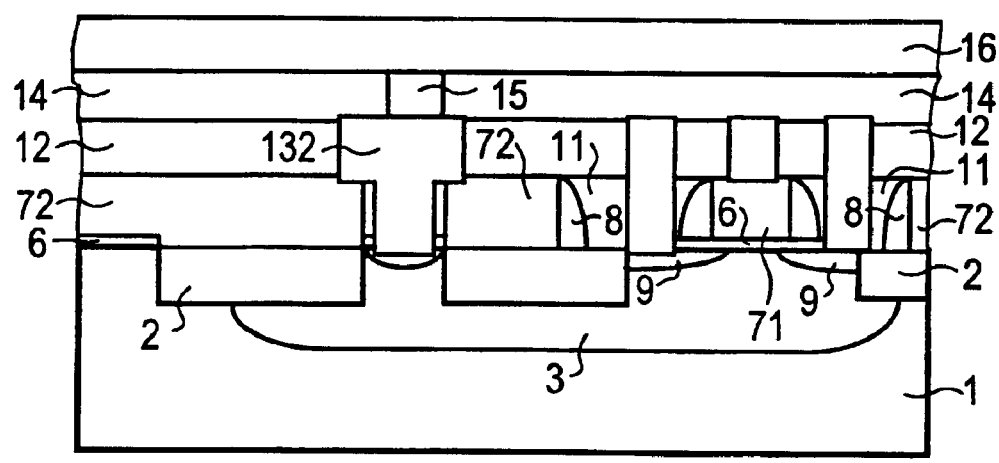
FIG. 7 shows the cross-section through the semiconductor substrate as shown in FIG. 1 after formation of a metallization layer and a further contact between the conductive filler structure and the metallization layer.

Referring to FIG. 7, subsequently a second intermediate oxide layer 14 is deposited wherein a further through hole that meets the overlapping contact 132 is opened. The further through hole is filled with a further contact 15, for example, of tungsten. Finally, a metallization layer 16 is formed that is in communication with further contact 15. The metallization layer 16 is applied to the same potential as the doped well 3 during operation of the circuit arrangement.

Although modifications and changes may be suggested by those of ordinary skill in the art, it is the intention of the inventors to embody within the patent warranted hereon all changes and modifications as reasonably and properly come within the scope of their contribution to the art.

We claim:

1. An integrated circuit arrangement comprising: a semiconductor substrate having at least one doped region; a plane arranged an a surface of said semiconductor substrate and having a number of conductive useful structures and at least one conductive filter structure which exhibits essentially the same height, said conductive filler structure having no circuit oriented function, said conductive filler structure being conductively connected to said doped region; and a contact connecting said conductive filler structure to said doped region via a through hole; wherein said through hole overlaps said conductive filler structure and said doped region exposing a surface of said conductive filler structure and a surface of said doped region said contact being in communication with sold surface of said conductive filler structure and said surface of said doped region.

2. The integrated circuit arrangement according to claim 1, further comprising:
    a planarizing insulation layer surrounding said conductive useful structures and said conductive filler structure; and
    wherein said conductive useful structures and said conductive filler structure are essentially a same height.

3. The integrated circuit arrangement according to claim 1, wherein said conductive useful structures are gate electrodes; and wherein said conductive filler structure contains a material of said gate electrodes.

4. The integrated circuit arrangement according to claim 1, wherein said doped region is a doped well in said semiconductor substrate.

5. The integrated circuit arrangement according to claim 1, further comprising:
    a metallization layer arranged above said plane wherein said conductive filler structure is arranged; and
    a further contact connecting said conductive filler structure to said metallization layer.

6. A method for manufacturing an integrated circuit arrangement, said method comprising the steps of: forming a doped region in a semiconductor substrate; forming a plane on a surface of said semiconductor substrate by applying and structuring a conductive layer, said plane having a number of conductive useful structures and at least one conductive filler structure, producing an insulation layer surrounding and covering said conductive useful structures and said conductive filler structure; producing a conductive connection between said conductive filler structure and said doped region; opening a through hole in said insulation layer, said through hole respectively partially overlapping said conductive filler structure and said doped region for partially uncovering a surface of said doped region and a surface of said conductive filler structure; and forming a contact in said through hole, said contact being in communication with said surface of said conductive filler structure and said surface of said doped region.

7. The method according to claim 6, further comprising the steps of:
    producing a metallization layer above said plane wherein said conductive filler structure is formed; and
    producing a further contact connecting said conductive filer structure to said metallization layer.

8. The integrated circuit arrangement according to claim 1, wherein said doped region is said semiconductor substrate.

9. The integrated circuit arrangement according to claim 1, wherein the at least one conducive filler structure comprises:
    a plurality of conductive filler structures that are arranged to establish a uniform geometrical occupation by the conductive useful structures and the conductive filler structures.

10. The method according to claim 6, wherein the conductive useful structures and the conductive filler structure exhibit essentially the same height, the conductive filler structure having no circuit-oriented function.

11. The method according to claim 6, wherein a plurality of conductive filler structures is provided, the conductive filler structures being arranged such that a uniform geometrical occupation by the conductive useful structures and the conductive filler structures is established.

* * * * *